(12) United States Patent
Liebaug et al.

(10) Patent No.: US 10,831,114 B2
(45) Date of Patent: Nov. 10, 2020

(54) LITHOGRAPHY APPARATUS AND METHOD

(71) Applicant: Carl Zeiss SMT GmbH, Oberkochen (DE)

(72) Inventors: Björn Liebaug, Ulm (DE);
Franz-Josef Stickel, Aalen (DE);
Jürgen Hofmann, Ellwangen (DE);
Dietmar Dürr, Dettingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/545,560

(22) Filed: Aug. 20, 2019

(65) Prior Publication Data

US 2019/0377273 A1    Dec. 12, 2019

Related U.S. Application Data

(63) Continuation of application No. PCT/EP2018/052301, filed on Jan. 30, 2018.

(30) Foreign Application Priority Data

Feb. 24, 2017 (DE) .......................... 10 2017 203 079

(51) Int. Cl.
*G03F 7/20* (2006.01)

(52) U.S. Cl.
CPC ........ *G03F 7/70833* (2013.01); *G03F 7/7015* (2013.01); *G03F 7/70825* (2013.01)

(58) Field of Classification Search
CPC . G03F 7/70833; G03F 7/7015; G03F 7/70825
USPC ................................................. 359/819–820
See application file for complete search history.

(56) References Cited

U.S. PATENT DOCUMENTS

| | | | |
|---|---|---|---|
| 6,271,976 B1* | 8/2001 | Weber | G02B 7/003 359/819 |
| 8,582,081 B2* | 11/2013 | Sorg | G02B 7/00 355/53 |
| 10,042,125 B2* | 8/2018 | Pitwon | G02B 6/3826 |
| 10,168,619 B1* | 1/2019 | Zweering | G03F 7/70825 |
| 2002/0167740 A1* | 11/2002 | Osterried | G02B 7/02 359/819 |
| 2008/0266686 A1 | 10/2008 | Dengel | |
| 2008/0307716 A1 | 12/2008 | Fisher et al. | |

FOREIGN PATENT DOCUMENTS

| DE | 101 21 346 A1 | 11/2002 |
|---|---|---|
| DE | 10 2006 031 654 A1 | 10/2007 |

OTHER PUBLICATIONS

Translation of International Search Report for corresponding Appl No. PCT/EP2018/052301, dated May 8, 2018.

* cited by examiner

*Primary Examiner* — Hung Nguyen
(74) *Attorney, Agent, or Firm* — Fish & Richardson P.C.

(57) ABSTRACT

A lithography machine includes an optical element, an interface coupled to the optical element, and a component which is separate from the interface. The interface is directly connected to the optical element. The optical element includes an engaging section. The component has a counter engaging section configured to engage with the engaging section of the optical element to connect the component form-fittingly and/or force-fittingly to the optical element.

20 Claims, 6 Drawing Sheets

LITHOGRAPHY APPARATUS AND METHOD

FIELD

The present disclosure relates to a lithography apparatus and to a method for producing a lithography apparatus of this type.

BACKGROUND

The content of the priority application DE 10 2017 203 079.8 is incorporated by reference in its entirety.

Microlithography is used for producing microstructured components, such as for example integrated circuits. The microlithography process is performed using a lithography apparatus, which has an illumination system and a projection system. The image of a mask (reticle) illuminated via the illumination system is in this case projected via the projection system onto a substrate (for example a silicon wafer) which is coated with a light-sensitive layer (photoresist) and arranged in an image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range from 0.1 nm to 30 nm, in particular 13.5 nm. In the case of such EUV lithography apparatuses, because of the high absorption of light of this wavelength by most materials, reflective optical units, that is to say mirrors, are used instead of—as previously—refractive optical units, that is to say lens elements.

Optical elements, for example mirrors or lens elements, of a lithography apparatus can be coupled with the aid of an interface, for example a mount. By way of example, an optical element of this type can be accommodated in the interface. At the interface in turn, further components such as, for example, light protection screens, protection devices and, in particular for application in immersion lithography, flow guiding elements for an immersion liquid or purge media, can be secured to the interface. In this case, it is desired to adjust the additional component relative to the interface.

SUMMARY

The present disclosure seeks to provide an improved lithography apparatus.

Accordingly, what is proposed is a lithography apparatus including an optical element, an interface coupled to the optical element, and a component separate from the interface, the component being connected to the optical element directly in a positively locking manner and/or in a force-locking manner. In this case, the optical element includes an engagement section and the component includes a mating engagement section configured to engage into the engagement section in order to connect the component to the optical element in a positively locking manner and/or in a force-locking manner.

By virtue of the fact that the component is directly secured to the optical element, it is possible to dispense with connecting the component to the optical element indirectly, that is to say with the aid of the interface. As a result, it is possible to dispense with adjusting the component relative to the interface. Furthermore, it is possible to dispense with a bulky and stiff design for the component. Furthermore, a reduction of structural space can also be achieved. An undesired coupling of the component to the interface is obviated. Furthermore, it is also possible to dispense with a non-releasable connection or a connection that is difficult to release, for example an adhesive bonding of the component to the optical element.

In the present case, a direct connection should be understood to mean a connection which is produced without additional components, such as screws or clamps, for example, or additives, such as adhesives, for example, between the component and the optical element. That is to say that the component is directly connected to the optical element. A positively locking connection arises as a result of at least two connection partners, in this case the optical element and the interface, engaging into or behind one another. A force-locking connection presupposes a normal force on the surfaces to be connected to one another. Force-locking connections can be realized by frictional engagement. The mutual displacement of the surfaces is prevented as long as a counterforce brought about by the static friction is not exceeded. The fact that the component is separate from the interface should be understood to mean that the component and the interface are two mutually separate structural elements that are not connected or coupled to one another. There is therefore no coupling or connection between the interface and the component.

The interface can be a mount, for example. With the aid of the interface, the optical element can be coupled to a projection system of the lithography apparatus, in particular to a carrying frame of the projection system. Preferably, the interface carries or holds the optical element. By way of example, the optical element can be accommodated in the interface. The interface can be coupled to the optical element with the aid of a connection. The connection can be a positively locking, force-locking or frictionally locking, or cohesive connection. The connection can also be a combined positively locking, force-locking and/or cohesive connection. In cohesive connections, the connection partners are held together by atomic or molecular forces. Cohesive connections are non-releasable connections that can be separated only by destruction of the connection mechanism or connection partners. Preferably, the optical element, the interface and the component are part of an optical system of the lithography apparatus. The optical device can be for example a projection system of the lithography apparatus.

The optical element includes an engagement section and the component includes a mating engagement section configured to engage into the engagement section in order to connect the component to the optical element in a positively locking manner and/or in a force-locking manner.

The connection between the optical element and the component can be either only positively locking, only force-locking or positively locking and force-locking. By way of example, the connection between the optical element and the component can be positively locking in a first spatial direction or x-direction and in a second spatial direction or y-direction and force-locking in a third direction or z-direction.

In accordance with a further embodiment, the mating engagement section includes elastically deformable mating engagement elements.

Preferably, at least two mating engagement elements are provided, which are arranged opposite one another. A gap can be provided between the two mating engagement elements. The mating engagement elements are preferably embodied as snap-action hooks or can be referred to as snap-action hooks. Preferably, the component includes a plate-shaped base section having a front side facing away from the optical element and a rear side facing the optical element. Preferably, the mating engagement section having the mating engagement elements extends out from the rear side. Each mating engagement element preferably includes a hooked engaging-behind section and a base section arranged between the engaging-behind section and the plate-shaped base section of the component. Preferably, the base section is spring-elastically deformable. A gap can be provided between the rear side of the base section of the component and the front side of the optical element. The gap can be filled with a medium, in particular with an immersion liquid, partly filled or free of the medium.

In accordance with a further embodiment, the mating engagement elements are spring-pressed with a prestress force against a wall of the engagement section in order to produce a force-locking connection between the component and the optical element.

Preferably, the mating engagement elements each include an elastically deformable base section and an engaging-behind section configured to apply the prestress force to the wall. Preferably, the engagement section is embodied as a cylindrical hole or as a groove. For the case where the engagement section is embodied as a cylindrical hole, the wall is likewise embodied in a cylindrical fashion and extends around the engagement section. For the case where the engagement section is in the form of a groove, two walls situated opposite one another are provided. In particular, each mating engagement element of the mating engagement section applies a prestress force to the wall. Preferably, the component is produced from a material, in particular from a plastics material, which has a low creep tendency. Creep in materials denotes the time- and temperature-dependent plastic deformation under constant load. The fact that the material has a low creep tendency makes it possible to ensure that the prestress force is always maintained.

In accordance with a further embodiment, the mating engagement elements engage behind an undercut of the engagement section in a positively locking manner in order to produce a positively locking connection between the component and the optical element.

The undercut is preferably frustoconical or wedge- or arrow-shaped.

In accordance with a further embodiment, the mating engagement elements each include an elastically deformable base section and an engaging-behind section configured to engage behind the undercut in a positively locking manner.

A gap is preferably provided between the mating engagement elements. In the course of the component being secured to the optical element, the mating engagement elements are pressed into the engagement section, wherein the base sections of the mating engagement elements become deformed. The engaging-behind sections of the mating engagement elements then snap into the undercut of the engagement section and connect the component to the optical element in a positively locking manner.

In accordance with a further embodiment, the engagement section includes a first section, a second section and the undercut arranged between the first section and the second section, wherein a width or a diameter of the first section is less than a width or a diameter of the second section.

The first section can be embodied rotationally symmetrically with respect to a center axis or axis of symmetry. Alternatively, the first section can be embodied in the form of a groove. The second section can likewise be embodied rotationally symmetrically with respect to the axis of symmetry or in the form of a groove. The undercut is preferably likewise embodied rotationally symmetrically with respect to the center axis with a frustoconical shape or as groove-type geometry with inclined sidewalls. The engagement section is thus preferably embodied as a stepped hole or a stepped groove. By virtue of the fact that the width or the diameter of the first section is less than the width or the diameter of the second section, the component can be fixed to the optical element in the third spatial direction or z-direction. Preferably, a width of the mating engagement section is at least slightly less than the width or the diameter of the first section and a width of the engaging-behind sections is preferably likewise at least slightly less than the width or the diameter of the second section. Preferably, a depth of the mating engagement section is also less than a corresponding depth of the engagement section. As a result, in the mounted state of the component, no stresses are introduced into the optical element. Slight stresses may be introduced into the optical element merely during the mounting of the component on the optical element.

In accordance with a further embodiment, the engagement section extends into the optical element from a front side of the optical element facing the component in the direction of a rear side of the optical element.

Preferably, the engagement section is embodied as an, in particular stepped, hole or groove proceeding from the front side.

In accordance with a further embodiment, the engagement section extends into the optical element from a sidewall of the optical element.

Preferably, the engagement section is embodied as a groove extending around the sidewall. Alternatively, the engagement section can also be embodied as a multiplicity of holes or grooves extending into the optical element from the sidewall. If the optical element is embodied rotationally symmetrically, the sidewall can be embodied as a cylindrical sidewall extending circumferentially. Alternatively, if the optical element is polygonal, it can include a multiplicity of sidewalls.

In accordance with a further embodiment, the mating engagement section is spring-prestressed with a prestress force against a sidewall of the optical element in order to produce a force-locking connection between the component and the optical element.

As a result, it is possible to achieve, in particular, a force-locking connection in the z-direction. A positively locking connection between the component and the optical element is preferably formed in the x-direction and the y direction. The mating engagement section can be embodied as an edge or collar extending around the optical element. Alternatively, the mating engagement section can be embodied in a multiplicity of individual mating engagement sections or snap-action hooks arranged in a manner distributed uniformly around the component.

In accordance with a further embodiment, the optical element is accommodated in the mating engagement section.

Preferably, the mating engagement section is pressed onto the optical element, wherein the mating engagement section is elastically deformed. The mating engagement section can be subdivided into a multiplicity of individual mating engagement sections. The mating engagement section can extend around the optical element in the form of a collar or in the form of a frame.

In accordance with a further embodiment, the component is produced from a plastics material, in particular from a fluoropolymer or a polyimide.

By virtue of the fact that the component is produced from a soft plastics material, stresses introduced into the optical element are low to nonexistent. In particular, the component can be produced from polytetrafluoroethylene (PTFE), polyvinylidene fluoride (PVDF), a perfluoroalkoxy polymer (PFA) or a perfluoroethylene propylene (FEP). Alternatively, the component can be produced from polyetherimide (PEI), for example. These materials mentioned above have a low creep tendency. The component can be produced for example in a primary forming method, such as an injection molding method, for example, or in a separating method, such as milling, for example. In particular, the component is embodied in one piece, preferably materially integrally. That is to say that the mating engagement section and the base section of the component are a common structural element.

Furthermore, a method for producing a lithography apparatus is proposed. The method includes the following steps: a) providing an optical element including an engagement section, and an interface coupled to the optical element, b) providing a component separate from the interface, the component including a mating engagement section, and c) connecting the component to the optical element directly in a positively locking manner and/or in a force-locking manner, wherein the mating engagement section engages into the engagement section.

The optical element can be coupled to the interface before or after the component is connected to the optical element. By way of example, in the course of providing the optical element and the interface, the optical element is accommodated in the interface. Preferably, the interface carries or supports the optical element. The interface can be part of a carrying frame of the lithography apparatus or of a projection system of the lithography apparatus.

In accordance with one embodiment, in step c) the mating engagement section of the component is accommodated in the engagement section of the optical element in a positively locking manner.

Alternatively or additionally, the mating engagement section can also be accommodated in the engagement section of the optical element in a force-locking manner.

In accordance with a further embodiment, in step c) the component is deformed spring-elastically at least in sections.

Preferably, in step c) mating engagement elements of the mating engagement section are deformed spring-elastically.

Further possible implementations of the disclosure also include not explicitly mentioned combinations of features or embodiments described above or below with respect to the exemplary embodiments. In this case, the person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described below.

BRIEF DESCRIPTION OF THE DRAWINGS

The disclosure is explained in greater detail below on the basis of preferred embodiments with reference to the accompanying figures, in which.

DETAILED DESCRIPTION

In the figures, identical or functionally identical elements have been provided with the same reference signs, unless indicated to the contrary. Insofar as a reference sign has a plurality of reference lines in the present case, this means that the corresponding element is present multiply. Reference sign lines pointing to concealed details are illustrated in a dashed manner. It should also be noted that the illustrations in the figures are not necessarily true to scale.

Figure 1:
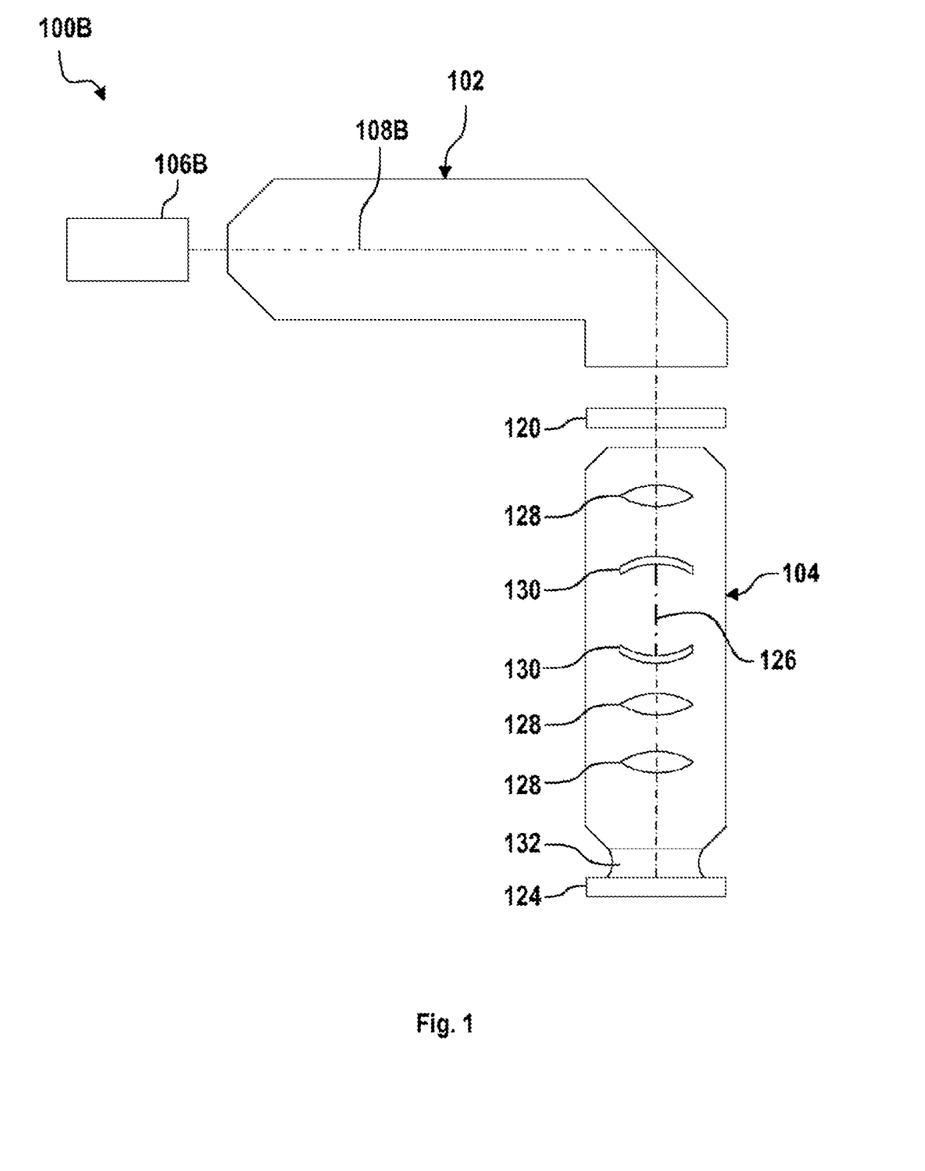
FIG. 1 shows a schematic view of a lithography apparatus.

FIG. 1 shows a schematic view of a lithography apparatus, in particular of a DUV lithography apparatus 100B, which includes a beam shaping and illumination system 102 and a projection system 104. In this case, DUV stands for "deep ultraviolet" and refers to a wavelength of the working light of between 30 nm and 250 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which the drive devices for mechanically moving or adjusting the optical elements are provided. Moreover, electrical controllers and the like can also be provided in this machine room.

The DUV lithography apparatus 100B includes a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1 guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements and mirrors of the DUV lithography apparatus 100B is not restricted to the number illustrated. More or fewer lens elements and/or mirrors can also be provided. Furthermore, the mirrors are generally curved on their front side for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Figure 2:
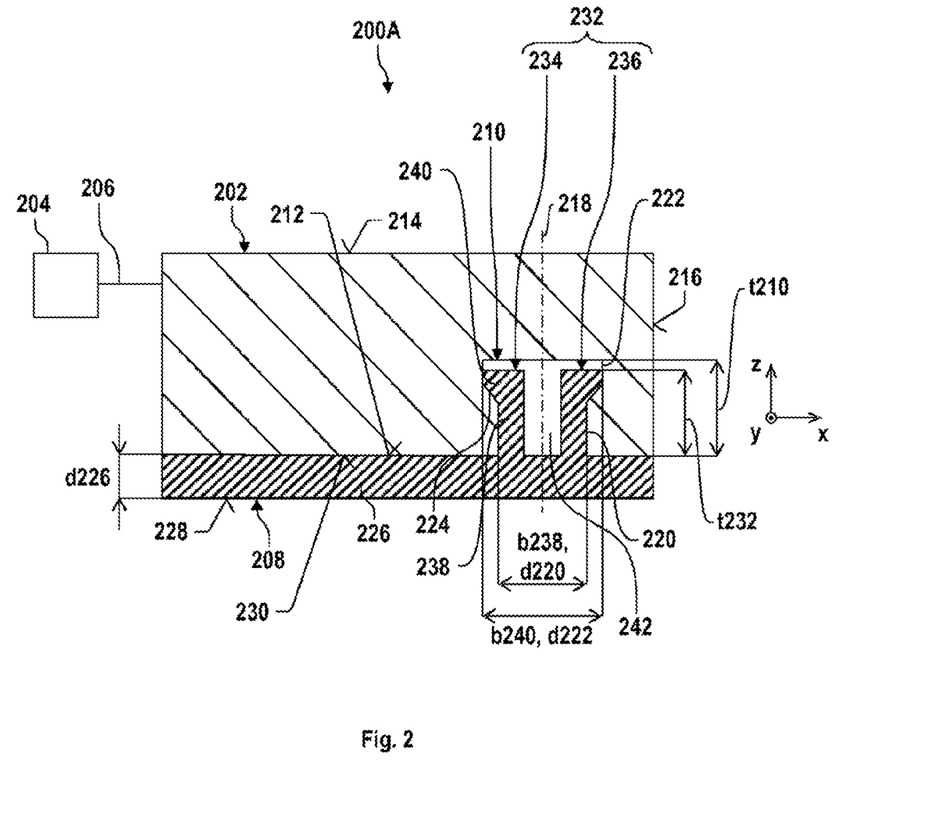
FIG. 2 shows a schematic sectional view of one embodiment of an optical system for a lithography apparatus in accordance with FIG. 1.

FIG. 2 shows a schematic sectional view of one embodiment of an optical system 200A for a lithography apparatus, in particular for a DUV lithography apparatus 100B. The optical system 200A includes an optical element 202. The optical element 202 can be for example a last lens element 128 of the DUV lithography apparatus 100B in accordance with FIG. 1, which is wetted with the liquid medium 132. Furthermore, the optical element 202 can be one of the mirrors 130. The optical element 202 can furthermore be part of a stop. The optical system 200A can be for example a projection system 104 of the DUV lithography apparatus 100B in accordance with FIG. 1.

The optical system 200A furthermore includes an interface 204. The optical element 202 is coupled to the interface 204. The interface 204 can be for example a mount, a thermal link or a component measurement technology. Preferably, the interface 204 carries or holds the optical element 202. By way of example, the optical element 202 can be accommodated in the interface 204. The interface 204 can be coupled to the optical element 202 with the aid of a connection 206. The optical element 202 can be coupled to a carrying frame of the projection system 104 or the DUV lithography apparatus 100B with the aid of the interface 204.

The connection 206 can be a positively locking, force-locking or frictionally locking, or cohesive connection. The connection 206 can also be a combined positively locking, force-locking and/or cohesive connection. A positively locking connection arises as a result of at least two connection partners, in this case the optical element 202 and the interface 204, engaging into or behind one another. For this purpose, at the optical element 202 provision can be made of cutouts, grooves, holes, or the like, into which the interface 204 engages in a positively locking manner. Conversely, at the interface 204, too, provision can be made of cutouts, grooves, holes, or the like, into which the optical element 202 engages in a positively locking manner.

A force-locking connection presupposes a normal force on the surfaces to be connected to one another. Force-locking connections can be realized by frictional engagement. The mutual displacement of the surfaces is prevented as long as a counterforce brought about by the static friction is not exceeded. A force-locking connection can also be present as a magnetic force-locking engagement. In cohesive connections, the connection partners are held together by atomic or molecular forces. Cohesive connections are non-releasable connections that can be separated only by destruction of the connection mechanism or connection partners. Cohesive enables connection by adhesive bonding, soldering, welding or vulcanization, for example.

The optical system 200A furthermore includes a component 208 separate from the interface 204. The component 208 can be for example a light protection screen, a protection element or, particularly in the application for a projection system 104 in immersion lithography, a flow guiding element for immersion liquid or purge media.

The fact that the component 208 is separate from the interface 204 should be understood to mean that the component 208 and the interface 204 are two mutually separate structural elements that are not connected or coupled to one another. There is therefore no coupling or connection between the interface 204 and the component 208.

The component 208 is directly connected to the optical element 202. In the present case, a direct connection should be understood to mean a connection which is produced without additional structural elements, such as screws or clamps, for example, or additives, such as adhesives, for example, between the component 208 and the optical element 202. That is to say that the component 208 is directly connected to the optical element 202.

In order to connect the component 208 to the optical element 202, the optical element 202 includes an engagement section 210. The engagement section 210 can be a geometry formed integrally on or in the optical element 202. By way of example, the engagement section 210 can be produced with the aid of machining of the optical element 202. For this purpose, the optical element 202 can be ground, for example. The engagement section 210 can be a cutout introduced into the optical element 202, for example in the form of a hole, groove, or the like. A multiplicity of engagement sections 210 can be provided.

As shown in FIG. 2, the engagement section 210 can be a cutout extending from a front side 212 in the direction of a rear side 214 of the optical element 202. In particular, the engagement section 210 is arranged within a circumferential sidewall 216 of the optical element 202. For the case where the optical element 202 is cylindrical, for example with a round or oval cross section, the sidewall 216 can also be cylindrical. For the case where the optical element 202 is polygonal, a plurality of sidewalls 216 can be provided.

The engagement section 210 can be constructed as a hole rotationally symmetrically with respect to a center axis or axis of symmetry 218. Alternatively, the engagement section 210 can also extend as a groove in a first spatial direction or x-direction x and/or a second spatial direction or y-direction y at least in sections through the optical element 202. The engagement section 210 can include a first section 220 extending in a third spatial direction or z-direction z proceeding from the front side 212, a second section 222 likewise extending in the z-direction z, and a third section or undercut 224, which is arranged between the first section 220 and the second section 222.

The first section 220 can be in the form of a groove or cylindrical and have a first width or a first diameter d220. Analogously thereto, the second section 222 can be in the form of a groove or cylindrical and have a second width or a second diameter d222. The second width or the second diameter d222 is greater than the first width or the first diameter d220. The undercut 224 connects the first section 220 to the second section 222 and can be in the form of a groove with inclined sidewalls or frustoconical and rotationally symmetrical with respect to the axis of symmetry 218. The engagement section 210 can furthermore have a depth t210. The depth t210 can be a few millimeters to centimeters. The depth t210 indicates how deeply the engagement section 210 extends into the optical element 202.

The component 208 includes a base section 226 having a front side 228 facing away from the front side 212 of the optical element 202, and a rear side 230 facing the front side 212. The rear side 230 of the base section 226 can bear over the whole area or in sections on the front side 212 of the optical element 202. The base section 226 has a thickness d226. The thickness d226 can be 0.1 to 1 millimeter. A gap can also be provided between the rear side 230 of the base section 226 and the front side 212 of the optical element 202. The gap can be filled with the medium 132, partly filled with the medium 132 or free of the medium 132.

A mating engagement section 232 of the component 208, the mating engagement section corresponding to the engagement section 210 of the optical element 202, extends out from the rear side 230 of the base section 226. The mating engagement section 232 can include a multiplicity of mating engagement elements 234, 236, but preferably at least two thereof, which are elastically, that is to say reversibly, deformable. The mating engagement elements 234, 236 are snap-action hooks or can be referred as snap-action hooks. The number of mating engagement sections 232 is arbitrary and corresponds to the number of engagement sections 210.

Each mating engagement element 234, 236 includes an elastically deformable base section 238, which is accommodatable in the first section 220 of the engagement section 210, and an engaging-behind section 240, which is accommodatable in the second section 222 of the engagement section 210 and which is configured to engage behind the undercut 224 of the engagement section 210 in a positively locking manner. The base sections 238 have a width b238 that is at least slightly less than the first width or the first diameter d220 of the first section 220 of the engagement section 210. The engaging-behind sections 240 have a width b240 that is at least slightly less than the second width or the second diameter d222 of the second section 222 of the engagement section 210. A depth t232 of the mating engagement section 232 is at least slightly less than the depth t210 of the engagement section 210. A groove or a gap 242 is provided between the mating engagement elements 234, 236.

The mating engagement section 232 is embodied in one piece, in particular materially integrally, with the base section 226, such that the mating engagement section 232 and the base section 226 are not separable from one another. The component 208 is produced from an elastically deformable and preferably soft plastics material. In particular, the component 208 can be produced from a fluoropolymer, in particular from a polytetrafluoroethylene (PTFE), polyvinylidene fluoride (PVDF), a perfluoroalkoxy polymer (PFA) or a perfluoroethylene propylene (FEP). Alternatively, the component 208 can be produced from a polyimide (PI), in particular polyetherimide (PEI). The component 208 can be produced for example in a primary forming method, such as an injection molding method, for example, or in a separating method, such as milling, for example.

The functionality of the optical system 200A is explained below. In order to connect the component 208 to the optical element 202, the mating engagement section 232 of the component 208 is brought into positively locking engagement with the engagement section 210 of the optical element 202. For this purpose, the mating engagement section 232 is pressed into the engagement section 210 in the z-direction z. In this case, the base sections 238 of the mating engagement elements 234, 236 become deformed when they are pressed through the first section 220 of the engagement section 210. In this case, the mating engagement elements 234, 236 move toward one another and are spring-prestressed outward against the first section 220.

As soon as the engaging-behind sections 240 of the mating engagement elements 234, 236 are pressed into the second section 222 of the engagement section 210, they move away from one another again on account of the spring prestress of the base sections 238 and engage behind the undercut 224 of the engagement section 210 in a positively locking manner. The component 208 is then fixed to the optical element 202 in the x-direction x and in the z-direction z. In addition, if the engagement section 210 is constructed rotationally symmetrically with respect to the axis of symmetry 218, the component 208 can also be fixed to the optical element 202 in the y-direction y. Separating the component 208 from the optical element 202 is possible only if the mating engagement section 232 is elastically deformed again.

By virtue of the fact that the component 208 is produced from a soft plastics material, stresses into the optical element 202 are low to nonexistent. By virtue moreover of the fact that the widths b238, b240 and the depth t232 of the mating engagement section 232 are less than the corresponding widths or the corresponding diameters d220, d222 and the corresponding depth t210 of the engagement section 210, in the mounted state of the component 208 no stresses are introduced into the optical element 202. Low stresses may be introduced into the optical element 202 merely during the mounting of the component 208 on the optical element 202.

By virtue of the fact that the component 208 is directly secured to the optical element 202, it is possible to dispense with connecting the component 208 to the optical element 202 indirectly, that is to say with the aid of the interface 204. As a result, it is possible to dispense with adjusting the component 208 relative to the interface 204. Furthermore, it is possible to dispense with a bulky and stiff design for the component 208. Furthermore, a reduction of structural space can also be achieved. An undesired coupling of the component 208 to the interface 204 is obviated. Furthermore, it is also possible to dispense with a non-releasable connection or a connection that is difficult to release, for example an adhesive bonding, of the component 208 to the optical element 202.

Figure 3:
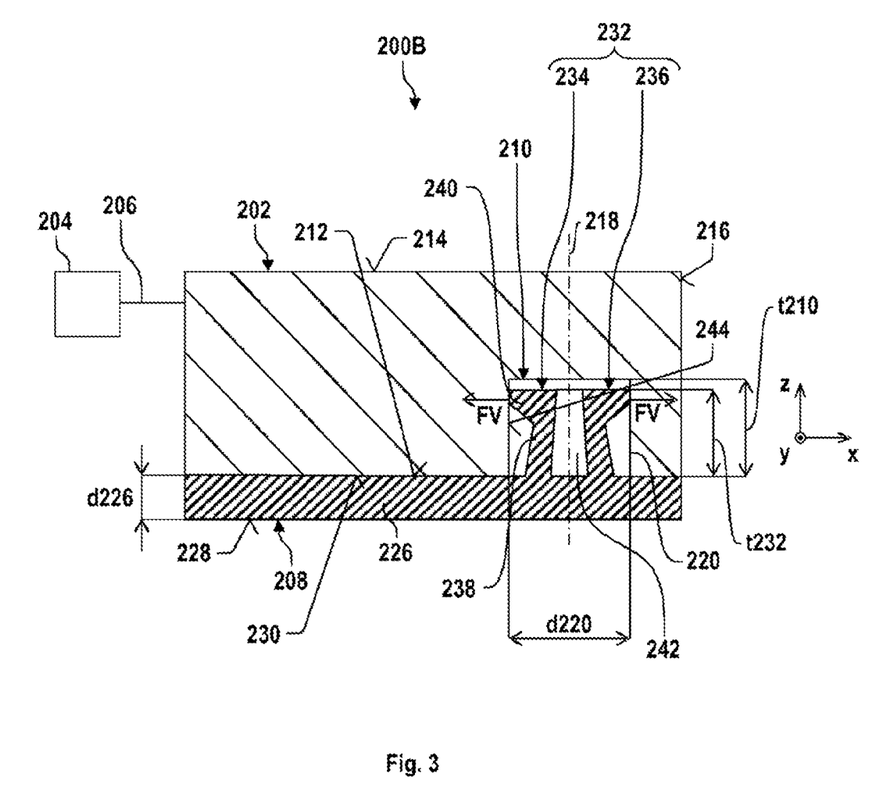
FIG. 3 shows a schematic sectional view of a further embodiment of an optical system for a lithography apparatus in accordance with FIG. 1.

FIG. 3 shows a schematic sectional view of a further embodiment of an optical system 200B for a lithography apparatus, in particular for a DUV lithography apparatus 100B. The optical system 200B in accordance with FIG. 3 differs from the optical system 200A in accordance with FIG. 2 merely in that the engagement section 210 includes only a first section 220 and not two sections 220, 222 and an undercut 224. The engagement section 210 or the first section 220 can be in the form of a groove or cylindrical and include a first width or a first diameter d220.

The component 208 is preferably embodied analogously to the component 208 shown in FIG. 2 and includes a base section 226 having a front side 228 facing away from the front side 212 of the optical element 202, and a rear side 230 facing the front side 212. A mating engagement section 232 of the component 208, the mating engagement section corresponding to the engagement section 210 of the optical element 202, extends out from the rear side 230 of the base section 226. The mating engagement section 232 can include a multiplicity of mating engagement elements 234, 236, but preferably at least two thereof, which are elastically, that is to say reversibly, deformable.

The number of mating engagement sections 232 is arbitrary and corresponds to the number of engagement sections 210. Each mating engagement element 234, 236 includes an elastically deformable base section 238, which is accommodatable in the first section 220 of the engagement section 210, and an engaging-behind section 240. The engaging-behind section 240 is preferably not configured to engage into the engagement section 210 in a positively locking manner. Rather, the engaging-behind sections 240 of the mating engagement section 232 are configured to fix the component 208 to the optical element 202 in a force-locking manner. For this purpose, a prestress force FV acts on a wall 244 of the first section 220 of the engagement section 210. For the case where the first section 220 is cylindrical, the wall 244 extends circumferentially. For the case where the first section 220 is in the form of a groove, two walls 244 arranged opposite one another are provided.

The functionality of the optical system 200B is explained below. In order to connect the component 208 to the optical element 202, the mating engagement section 232 of the component 208 is brought into positively locking engagement with the engagement section 210 of the optical element 202. For this purpose, the mating engagement section 232 is pressed into the engagement section 210 in the z-direction z. In this case, the base sections 238 of the mating engagement elements 234, 236 become deformed when they are pressed into the first section 220 of the engagement section 210. In this case, the mating engagement elements 234, 236 move toward one another and are spring-prestressed outward against the first section 220 with the prestress force FV. With the aid of the prestress force FV, a force-locking engagement between the component 208 and the optical element 202 is formed in the z-direction z. In addition, the component 208 can be fixed to the optical element 202 in the x-direction x and/or in the y-direction y with the aid of a positively locking engagement.

Preferably, the material from which the component 208 is produced has a very low creep tendency. Creep in materials denotes the time- and temperature-dependent plastic deformation under constant load. A characteristic figure for creep is the creep modulus or the creep coefficient. As a result, it is possible to ensure that the prestress force FV is always maintained. The use of a soft plastics material for the component 208 additionally ensures that the prestress force FV is so low that only low stresses are introduced into the optical element 202.

Figure 4:
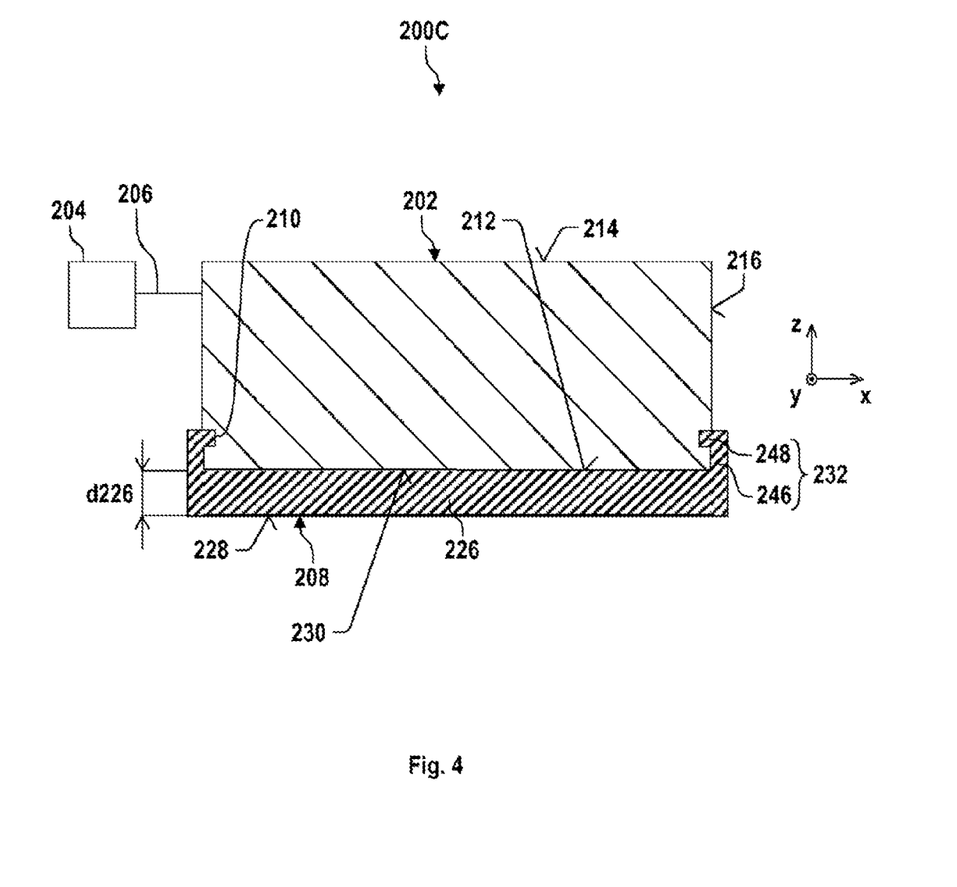
FIG. 4 shows a schematic sectional view of a further embodiment of an optical system for a lithography apparatus in accordance with FIG. 1.

FIG. 4 shows a schematic sectional view of a further embodiment of an optical system 200C for a lithography apparatus, in particular for a DUV lithography apparatus 100B. The optical system 200C in accordance with FIG. 4 differs from the optical system 200A in accordance with FIG. 2 in that the engagement section 210 is not embodied as a hole or groove extending into the optical element 202 from the front side 212 thereof, but rather as a groove extending laterally into the optical element 202 or as a multiplicity of holes extending laterally into the optical element 202.

By way of example, the engagement section 210 can be embodied as a groove extending around the optical element 202. Alternatively, a multiplicity of holes or grooves distributed at the sidewall 216 can be provided. In a manner corresponding to the engagement section 210, the mating engagement section 232 is provided as an edge extending around the base section 226 of the component 208 and having a spring-elastically deformable base section 246 and an engaging-behind section 248 configured to engage into the engagement section 210 in a positively locking manner. Alternatively, a multiplicity of mating engagement sections 232 can be provided, which are preferably embodied as snap-action hooks.

In order to connect the component 208 to the optical element 202, the component 208 is pressed onto the optical element 202. In this case, the base section 246 is elastically deformed and the engaging-behind section 248 snaps into the engagement section 210 and connects the component 208 to the optical element 202 in a positively locking manner. The component 208 is then fixed to the optical element 202 in a positively locking manner in the x-direction x, the y-direction y and the z-direction z.

Figure 5:
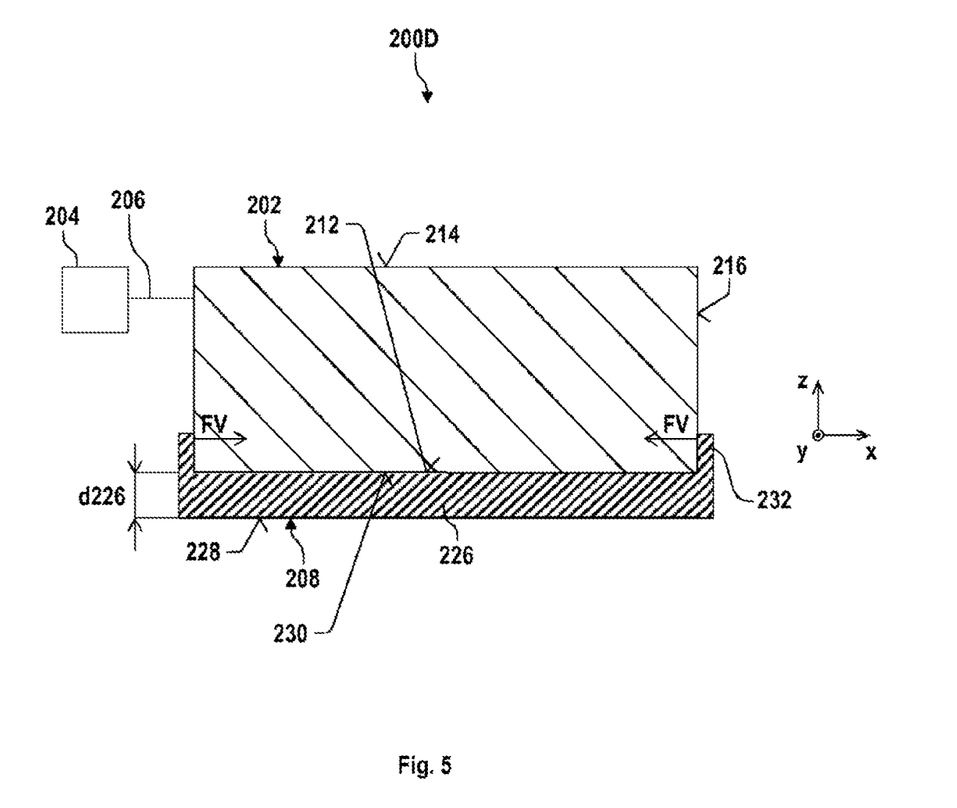
FIG. 5 shows a schematic sectional view of a further embodiment of an optical system for a lithography apparatus in accordance with FIG. 1.

FIG. 5 shows a schematic sectional view of a further embodiment of an optical system 200D for a lithography apparatus, in particular for a DUV lithography apparatus 100B. The optical system 200D in accordance with FIG. 4 differs from the optical system 200C in accordance with FIG. 4 in that no engagement section 210 is provided on the optical element 202. As a result, it is possible to dispense with machining of the optical element 202.

Furthermore, the mating engagement section 232 is embodied as a frame or an edge which extends around the optical element 202 and which is connected to the sidewall 216 of the optical element 202 in a force-locking manner. A multiplicity of mating engagement sections 232 can also be provided, which are arranged in a manner extending around the optical element 202 and in a manner preferably distributed uniformly.

In order to connect the component 208 to the optical element 202, the component 208 is pressed onto the optical element 202. In this case, the mating engagement section 232 is elastically deformed and connects the component 208 to the optical element 202 in a force-locking manner and in a positively locking manner. The mating engagement section 232 applies a prestress force FV to the optical element 202. With the aid of the prestress force FV, a force-locking engagement between the component 208 and the optical element 202 is formed in the z-direction z. In addition, the component 208 can be fixed to the optical element 202 in the x-direction x and/or in the y-direction y with the aid of a positively locking engagement.

Figure 6:
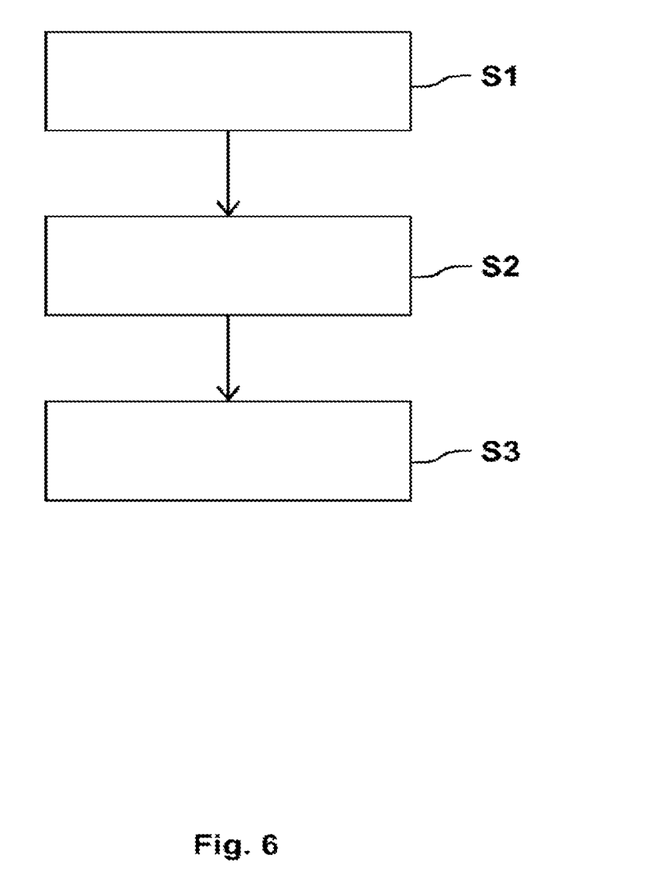
FIG. 6 shows a schematic block diagram of one embodiment of a method for producing a lithography apparatus in accordance with FIG. 1.

FIG. 6 shows a schematic block diagram of one embodiment of a method for producing a DUV lithography apparatus 100B. A step S1 involves providing the optical element 202 and the interface 204 coupled to the optical element 202. A step S2 involves providing the component 208 separate from the interface 204. Furthermore, a step S3 involves connecting the component 208 to the optical element 202 directly in a positively locking manner and/or in a force-locking manner.

Although the disclosure has been described here on the basis of preferred exemplary embodiments, it is not in any way restricted to them but rather can be modified in a wide variety of ways.

LIST OF REFERENCE SIGNS

100B DUV lithography apparatus
102 Beam shaping and illumination system
104 Projection system
106B DUV light source
108B DUV radiation
120 Photomask
124 Wafer
126 Optical axis
128 Lens element
130 Mirror
132 Medium
200A Optical system
200B Optical system
200C Optical system
200D Optical system
202 Optical element
204 Interface
206 Connection
208 Component
210 Engagement section
212 Front side
214 Rear side
216 Sidewall
218 Axis of symmetry
220 Section
222 Section
224 Undercut
226 Base section
228 Front side
230 Rear side
232 Mating engagement section
234 Mating engagement element
236 Mating engagement element
238 Base section
240 Engaging-behind section 242 Gap
244 Wall
246 Base section
248 Engaging-behind section
b238 Width
b240 Width
d220 Width/diameter
d222 Width/diameter
d226 Thickness
FV Prestress force
S1 Step
S2 Step
S3 Step
t210 Depth
t232 Depth
x x-direction
y y-direction
z z-direction

What is claimed is:

1. A method, comprising:
    a) providing an optical element comprising an engagement section, and an interface coupled to the optical element;
    b) providing a component separate from the interface, the component comprising elastically deformable mating engagement elements that are spring-prestressed with a prestress force; and
    c) configuring the elastically deformable mating engagement elements so that the prestress force is applied against a wall of the engagement section to connect the component to the optical element.

2. An apparatus, comprising:
an optical element;
an interface coupled to the optical element; and
a component separate from the interface,
wherein:
    the optical element comprises an engagement section;
    the component comprises elastically deformable mating engagement elements that are spring-prestressed with a prestress force against a wall of the engagement section to connect the component to the optical element; and
    the apparatus is a lithography apparatus.

3. The apparatus of claim 2, wherein the engagement section extends into the optical element from a front side of the optical element facing the component in a direction of a rear side of the optical element.

4. The apparatus of claim 2, wherein the engagement section extends into the optical element from a sidewall of the optical element.

5. The apparatus of claim 2, wherein the component comprises a plastics material.

6. The apparatus of claim 2, wherein the component comprises a material selected from the group consisting of a fluoro-polymer and a polyimide.

7. An apparatus, comprising:
an optical element;
an interface coupled to the optical element; and
a component separate from the interface,
wherein:
    the optical element comprises an engagement section;
    the component comprises elastically deformable mating engagement elements that engage behind an undercut of the engagement section to connect the component and the optical element; and
    the apparatus is a lithography apparatus.

8. The apparatus of claim 7, wherein:
the engagement section comprises a first section and a second section;
the undercut is between the first and second sections; and
a width or a diameter of the first section is less than a width or a diameter of the second section.

9. The apparatus of claim 7, wherein each mating engagement element comprises an elastically deformable base section and an engaging-behind section configured to engage behind the undercut.

10. The apparatus of claim 9, wherein:
the engagement section comprises a first section and a second section;
the undercut is between the first and second sections; and
a width or a diameter of the first section is less than a width or a diameter of the second section.

11. The apparatus of claim 7, wherein the apparatus comprises a projection system which comprises the optical element, the interface is coupled to the optical element, and the component is separate from the interface.

12. The apparatus of claim 7, wherein the engagement section extends into the optical element from a front side of the optical element facing the component in a direction of a rear side of the optical element.

13. The apparatus of claim 7, wherein the engagement section extends into the optical element from a sidewall of the optical element.

14. The apparatus of claim 7, wherein the elastically deformable mating engagement elements are spring-prestressed with a prestress force against a sidewall of the optical element.

15. The apparatus of claim 7, wherein the component comprises a plastics material.

16. The apparatus of claim 7, wherein the component comprises a material selected from the group consisting of a fluoro-polymer and a polyimide.

17. The apparatus of claim 7, wherein the apparatus comprises a projection system which comprises the optical element, the interface is coupled to the optical element, and the component is separate from the interface.

18. A method, comprising:
    a) providing an optical element comprising an engagement section, and an interface coupled to the optical element;
    b) providing a component separate from the interface, the component comprising elastically deformable mating engagement elements; and
    c) configuring the elastically deformable mating engagement elements so that they engage behind an undercut of the engagement section to connect the component to the optical element.

19. The method of claim 18, wherein:
each elastically deformable mating engagement element comprises an elastically deformable base section; and
the method comprises configuring the elastically deformable mating engagement elements so that the engaging-behind sections engage behind the undercut.

20. The apparatus of claim 18, wherein:
the engagement section comprises a first section and a second section;
the undercut is between the first and second sections; and
a width or a diameter of the first section is less than a width or a diameter of the second section.

* * * * *

UNITED STATES PATENT AND TRADEMARK OFFICE
CERTIFICATE OF CORRECTION

PATENT NO. : 10,831,114 B2
APPLICATION NO. : 16/545560
DATED : November 10, 2020
INVENTOR(S) : Björn Liebaug et al.

It is certified that error appears in the above-identified patent and that said Letters Patent is hereby corrected as shown below:

In the Claims

Column 14, Line 59, Claim 20, delete "apparatus" and insert -- method --.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*